United States Patent
Kurita et al.

(10) Patent No.: US 7,495,345 B2
(45) Date of Patent: Feb. 24, 2009

(54) SEMICONDUCTOR DEVICE-COMPOSING SUBSTRATE AND SEMICONDUCTOR DEVICE

(75) Inventors: Yoichiro Kurita, Kanagawa (JP); Koji Soejima, Kanagawa (JP); Masaya Kawano, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 317 days.

(21) Appl. No.: 11/543,084

(22) Filed: Oct. 5, 2006

(65) Prior Publication Data

US 2007/0023906 A1    Feb. 1, 2007

(30) Foreign Application Priority Data

Jul. 10, 2005  (JP) ............................. 2005-294960

(51) Int. Cl.
*H01L 23/28* (2006.01)
(52) U.S. Cl. .................. 257/787; 257/783; 257/778
(58) Field of Classification Search ................ 257/787, 257/778, 784, 666, 783
See application file for complete search history.

(56) References Cited

U.S. PATENT DOCUMENTS 6,011,315 A * 1/2000 Toyosawa et al. ........... 257/783
6,255,740 B1 * 7/2001 Tsuji et al. .................. 257/792
2003/0001244 A1 * 1/2003 Araki et al. ................. 257/666
2006/0252183 A1 * 11/2006 Fujimoto et al. ............ 438/123
2008/0191294 A1 * 8/2008 Ohta .......................... 257/415
2008/0199979 A1 * 8/2008 Kikuchi et al. ............... 438/15

FOREIGN PATENT DOCUMENTS

JP       10-12770       1/1998
JP       2003-324182    11/2003

* cited by examiner

Primary Examiner—S. V Clark
(74) Attorney, Agent, or Firm—McGinn IP Law Group, PLLC

(57) ABSTRACT

A semiconductor device-composing substrate 10 has a support base 12, an interconnect layer 14 including interconnects 13, and an insulating resin layer 16. The semiconductor device-composing substrate 10 also has a mounting region D1 on which a semiconductor chip 30 is to be mounted. The insulating resin layer 16 is formed on the interconnect layer 14. Chip-connecting electrodes 17, external electrode pads 18 and the resin stopper patterns 19 are formed in the insulating resin layer 16. The chip-connecting electrodes 17 are provided in the mounting region D1. The external electrode pads 18 are provided outside the mounting region D1. The resin stopper patterns 19 are provided between the mounting region D1 and the external electrode pads 18.

10 Claims, 16 Drawing Sheets

SEMICONDUCTOR DEVICE-COMPOSING SUBSTRATE AND SEMICONDUCTOR DEVICE

This application is based on Japanese patent application No. 2005-294960, the content of which is incorporated hereinto by reference.

BACKGROUND

1. Technical Field

The present invention relates to a semiconductor device-composing substrate and a semiconductor device.

2. Related Art

Conventionally known semiconductor devices include those described, for example, in Japanese Laid-Open patent publications No. 2003-324182 (patent document 1) and H10-12770 (patent document 2). Each of these semiconductor devices described in these documents has a semiconductor chip mounted by flip-chip bonding on a semiconductor device-composing substrate having an interconnect pattern preliminarily formed thereon. An underfill resin is filled in a gap between the substrate and the semiconductor chip.

FIG. 13 is a plan view showing a semiconductor device-composing substrate disclosed in the patent document 2. A region 111 on which the semiconductor chip is mounted is provided on the surface of the substrate. The surface of the substrate is covered with a solder resist 113, excluding partial regions 112 thereof. At portions 101 of each region 112, having interconnects 110 exposed therein, the substrate and the semiconductor chip are connected. Around the region 111, resin stopper patterns 114 are formed. The resin stopper patterns 114 are formed using the same material and in the same process with the interconnects 110, wherein some of them are formed as being integrated with the interconnects 110. One end of each interconnect 110 (end portion located outside the region 111) is connected to an external electrode pad not shown.

SUMMARY OF THE INVENTION

In the above-described semiconductor devices each having the underfill resin filled in the gap between the substrate and the semiconductor chip, it is critical, in the process of fabrication thereof, to avoid spillage of the underfill resin outwardly from the gap. This is because such spillage may contaminate the external electrode pads formed on the substrate with the underfill resin. Contamination of the external electrode pads results in degradation of reliability of thus-fabricated semiconductor devices.

In this point of view, the semiconductor device-composing substrate described in the patent document 2 is designed to block the spillage of the underfill resin, by providing the above-described resin stopper patterns 114. The configuration, however, cannot prevent the underfill resin from creeping along the interconnects 110 to reach the external electrode pads, as indicated by the arrow in FIG. 13.

According to the present invention, there is provided a semiconductor device-composing substrate having a mounting region on which a semiconductor chip is to be mounted, comprising an interconnect layer provided on a support base, and including an interconnect; an insulating layer provided on the interconnect layer; a chip-connecting electrode provided in the insulating layer located in the mounting region, one end of which connected to the interconnect, and the other end of which to be connected to a bump of the semiconductor chip; an external electrode pad provided in the insulating layer located outside the mounting region, one end of which connected to the interconnect, and the other end of which to be connected to an external electrode terminal to be provided on the insulating layer; and a resin stopper pattern provided in the insulating layer located between the mounting region and the external electrode pad, being exposed in a surface of the insulating layer, and being composed of an electro-conductive material.

This semiconductor device-composing substrate has the resin stopper pattern provided between the mounting region and the external electrode pad. The resin stopper pattern is composed of an electric conductor, and therefore has a poorer wettability to the underfill resin, as compared with the insulating layer having the pattern provided therein. For this reason, the underfill resin can successfully be prevented from climbing over the resin stopper pattern to reach the external electrode pad. Moreover, the resin stopper pattern is provided in a layer (the above-described insulating layer) different from the interconnect layer. Therefore, it is also made possible to prevent the underfill resin from creeping along the interconnect to reach the external electrode pad, unlike on the semiconductor device-composing substrate described in the patent document 2.

The present invention can therefore realize a semiconductor device-composing substrate suitable for fabricating a highly-reliable semiconductor device, and a semiconductor device using such substrate.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
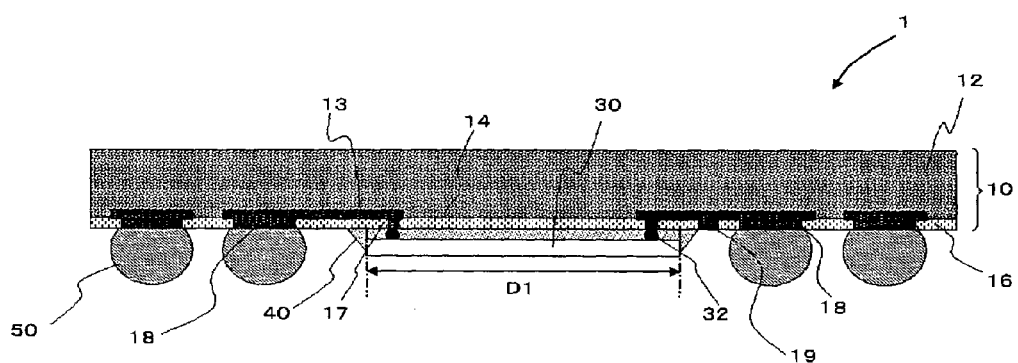
FIG. 1 is a sectional view showing a semiconductor device according to the first embodiment of the present invention.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will detail preferred embodiments of the semiconductor device-composing substrate and the semiconductor device of the present invention, referring to the attached drawings. Any constituents commonly appear in the drawings will be given with the same reference numerals, and explanations therefor will not be repeated.

First Embodiment

FIG. 1 is a sectional view showing a semiconductor device according to the first embodiment of the present invention. The semiconductor device 1 has a semiconductor device-composing substrate 10, a semiconductor chip 30, an underfill resin 40, and external electrode terminals 50.

The semiconductor device-composing substrate 10 has a support base 12, an interconnect layer 14, an insulating resin layer 16 (insulating layer), chip-connecting electrodes 17, external electrode pads 18 and resin stopper patterns 19. The semiconductor device-composing substrate 10 also has a mounting region D1, on which a semiconductor chip 30 is to be mounted. In this embodiment, the support base 12 is a resin substrate. A filler-containing epoxy resin, for example, is applicable as the material composing the resin substrate. Interconnects are formed in the surface layer of the support base 12. In the semiconductor device 1, the surface layer of the support base 12 containing the interconnects 13 corresponds to the interconnect layer 14. The insulating resin layer 16 is formed on the interconnect layer 14. Photosensitive polyimide resin, PBO (polybenzooxazole), epoxy resin and so forth are applicable as the materials for composing the insulating resin layer 16.

In the insulating resin layer 16, the chip-connecting electrodes 17, the external electrode pads 18 and the resin stopper patterns 19 are formed. The chip-connecting electrodes 17 are provided in the insulating resin layer 16, especially in the region thereof located in the mounting region D1. Each of the chip-connecting electrodes 17 penetrates the insulating resin layer 16, has one end thereof connected to each interconnect 13, and has other end exposed in the surface of the insulating resin layer 16. To the other end, each of later-described bumps 32 of the semiconductor chip 30 is to be connected.

The external electrode pads 18 are provided in the insulating resin layer 16, especially in the region thereof located outside the mounting region D1. Also each of the external electrode pads 18 penetrates the insulating resin layer 16, and has one end connected to each interconnect 13. In other words, each external electrode pad 18 is electrically connected to each chip-connecting electrode 17 through each interconnect 13. The other end of the external electrode pad 18 is exposed in the surface of the insulating resin layer 16, and is to be connected to each external electrode terminal 50.

The resin stopper patterns 19 are provided in the insulating resin layer 16, especially in the region thereof located outside the mounting region D1. More specifically, the resin stopper patterns 19 are provided between the mounting region D1 and the external electrode pads 18. Also each resin stopper pattern 19 has one end connected to each interconnect 13, and has the other end exposed in the surface of the insulating resin layer 16. The resin stopper patterns 19 are, however, not always necessarily connected to the interconnects 13, but may be apart from the interconnects 13.

The resin stopper patterns 19 are composed of an electro-conductive material. In particular in this embodiment, the resin stopper patterns 19 are composed of an electro-conductive material same as that composing the chip-connecting electrodes 17 and the external electrode pads 18. Cu may be used as the electro-conductive material.

The exposed surfaces of the chip-connecting electrodes 17, the external electrode pads 18 and the resin stopper patterns 19 are aligned almost in the same plane with the surface of the insulating resin layer 16. The surface of the insulating resin layer 16 is almost flat. An Au film may be formed respectively on the surfaces of the chip-connecting electrodes 17, the external electrode pads 18 and the resin stopper patterns 19, exposed in the surface of the insulating resin layer 16.

On thus-configured semiconductor device-composing substrate 10, the semiconductor chip 30 is mounted. The semiconductor chip 30 has the bumps 32, and is placed on the mounting region D1 of the semiconductor device-composing substrate 10 by allowing the bumps 32 to connect with the chip-connecting electrodes 17. The gap between the semiconductor device-composing substrate 10 and the semiconductor chip 30 is filled with the underfill resin 40. Further on the insulating resin layer 16 of the semiconductor device-composing substrate 10, the external electrode terminals 50 connected to the external electrode pads 18 are formed. The external electrode terminals 50 are, for instance, solder bumps.

Figure 2:
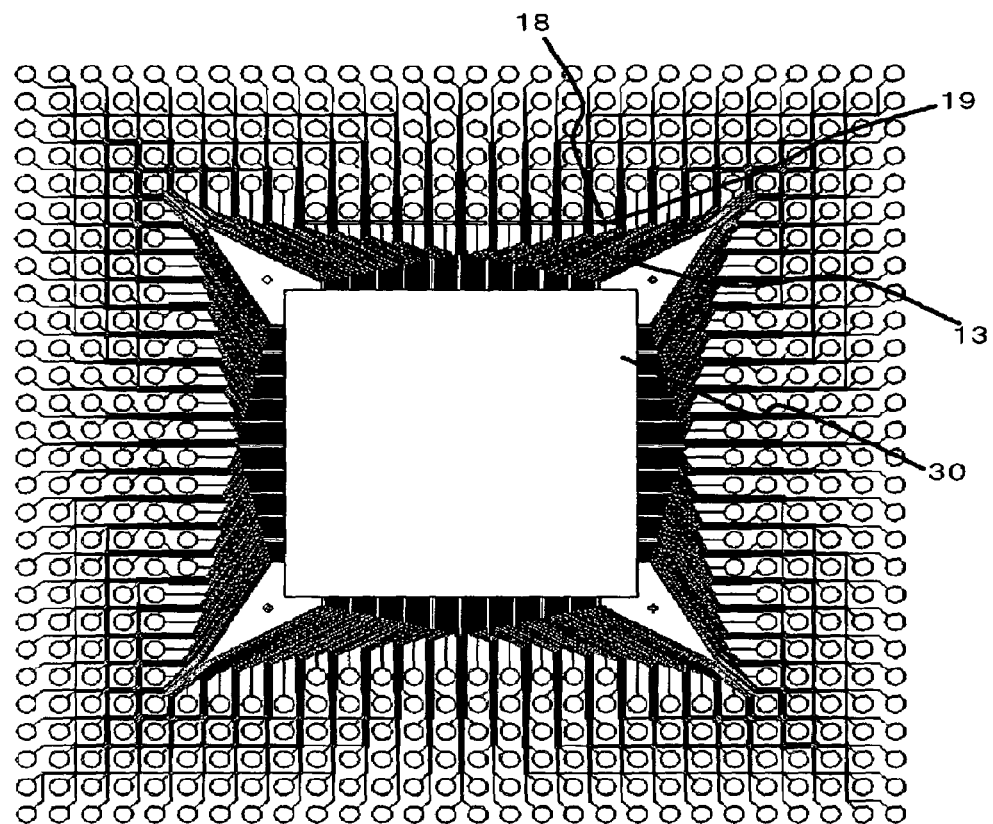
FIG. 2 is a plan view of the semiconductor device shown in FIG. 1.

FIG. 2 is a plan view of the semiconductor device 1 as viewed from the semiconductor chip 30 side. In this drawing, the external electrode terminals 50 are not illustrated, and instead the interconnects 13 located under the insulating resin layer 16 are shown. As is known from the drawing, the resin stopper patterns 19 are provided only on one side of the mounting region D1.

Figure 3:
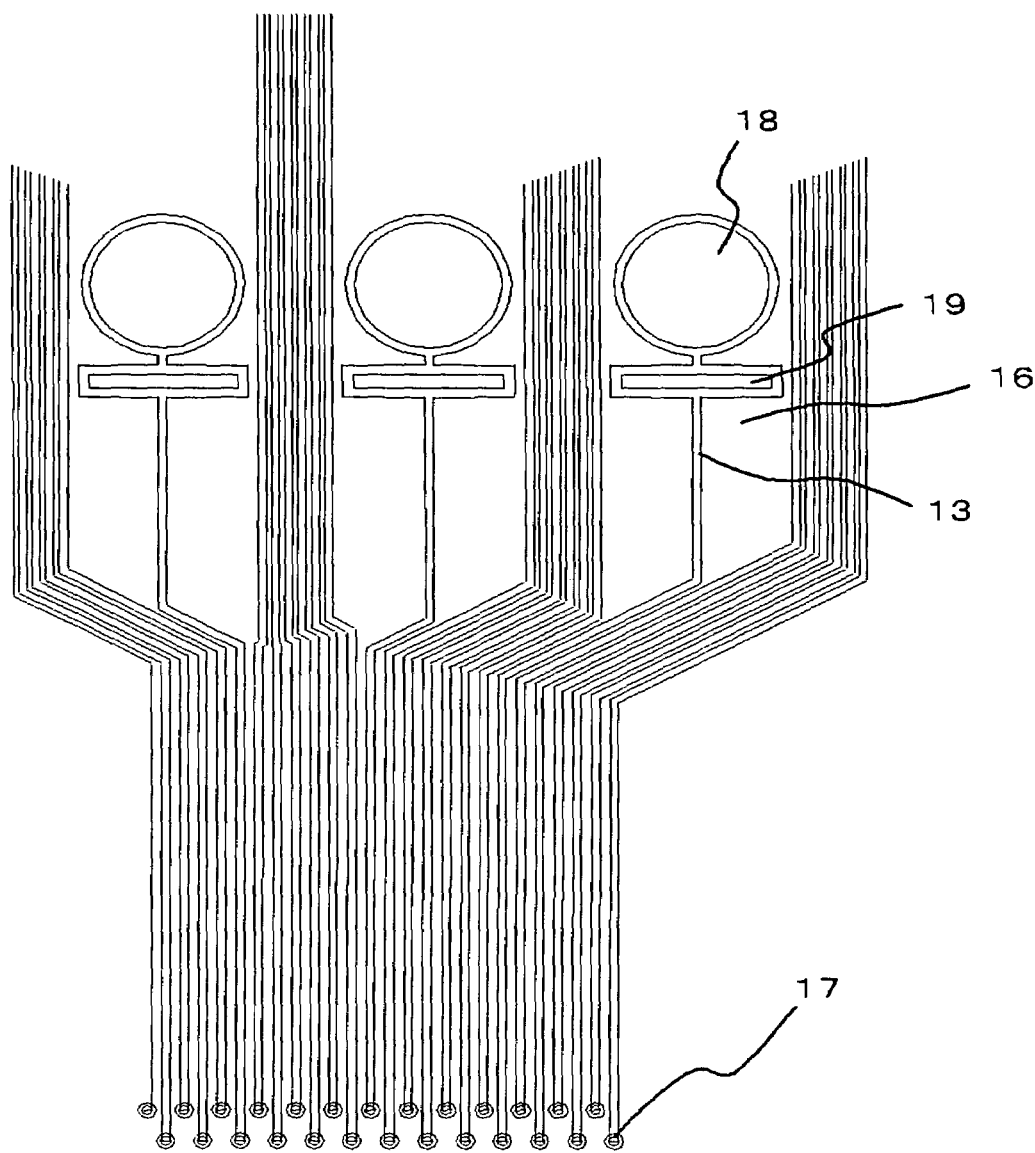
FIG. 3 is a plan view showing a part of the semiconductor device-composing substrate shown in FIG. 1.

FIG. 3 is a plan view showing a part of the surface of the semiconductor device-composing substrate 10 (insulating resin layer 16). The interconnects 13 are shown also in this drawing, similarly to FIG. 2. As is known from the drawing, on the surface of the insulating resin layer 16, the entire circumference of the resin stopper patterns 19 is surrounded by the insulating resin layer 16.

Figure 4A:
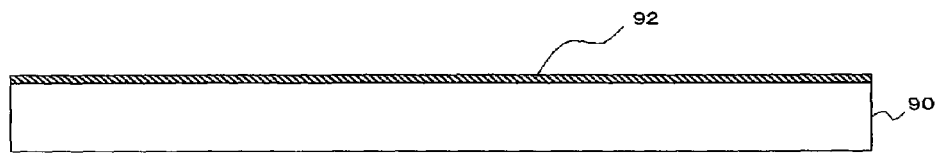
FIGS. 4A and 4B are sectional views showing an example of the manufacturing method of the semiconductor device shown in FIG. 1.
Figure 4B:
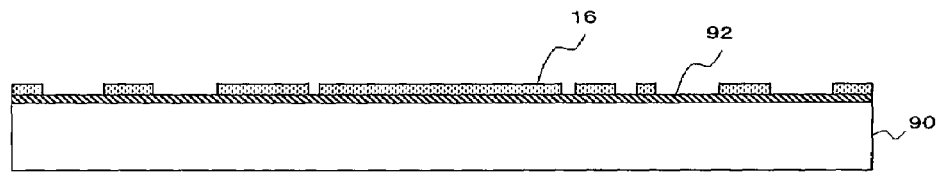

An exemplary method of manufacturing the semiconductor device 1 will be explained below, referring to FIGS. 4A to 7C. First, a seed layer 92, which is a metal thin film, is formed on a silicon wafer 90 by the sputtering process or the like (FIG. 4A). The patterned insulating resin layer 16 is then formed on the seed layer 92 (FIG. 4B).

Figure 5A:
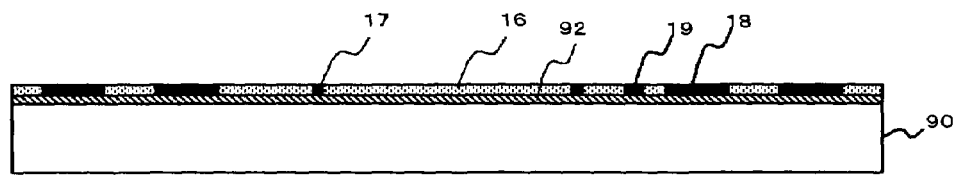
FIGS. 5A and 5B are sectional views showing the example of the manufacturing method of the semiconductor device shown in FIG. 1.
Figure 5B:
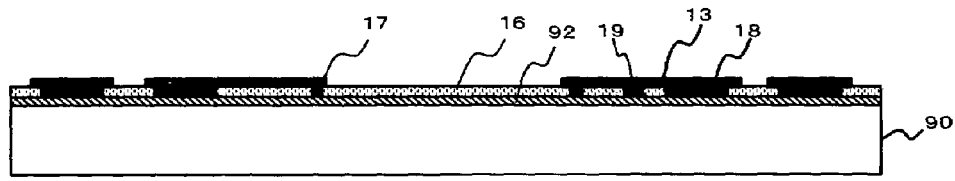

Next, conductor via-plugs are formed in the openings of the insulating resin layer 16, by plating using the seed layer 92 as a current supply layer or the like. The conductor via-plugs are destined for the chip-connecting electrodes 17, the external electrode pads 18 and the resin stopper patterns 19 (FIG. 5A). The interconnects 13 are then formed on the insulating resin layer 16, by the semi-additive process or the like (FIG. 5B).

Figure 6A:
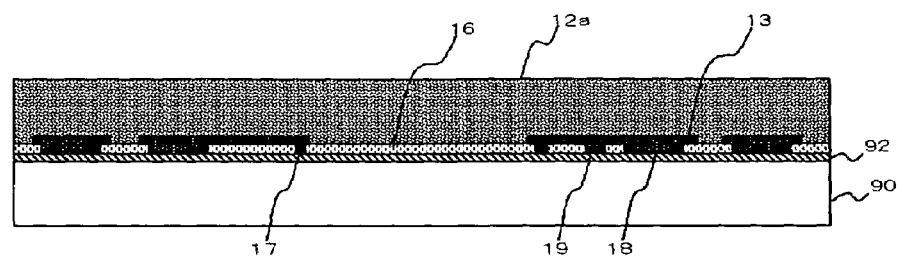
FIGS. 6A and 6B are sectional views showing the example of the manufacturing method of the semiconductor device shown in FIG. 1.
Figure 6B:
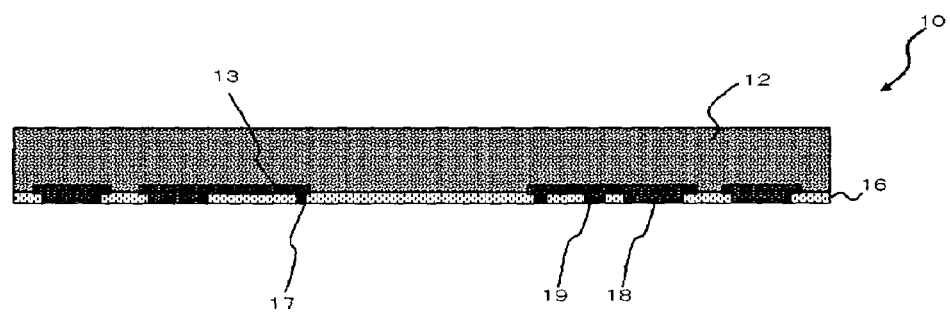

Next, an insulating resin layer 12a destined for the support base 12 is formed over the entire surface of the insulating resin layer 16 and the interconnects 13, by the molding process or the like (FIG. 6A). The silicon wafer 90 is then removed, and the seed layer 92 is etched off. Preferable methods of removing the silicon wafer 90 include grinding, chemical mechanical polishing (CMP), etching and so forth. These methods may also be combined. For example, the silicon wafer 90 may be ground off, and the residual portion may be removed by chemical mechanical polishing or etching, or by the both. Both of dry etching and wet etching may be allowable for the etching. Use of dry etching for the step of completely removing the residual portion of the silicon wafer 90 can stably leave the seed layer 92, because a large etching selectivity can be ensured. An Au film is then formed, by electroless plating or the like, on the exposed surfaces of the chip-connecting electrodes 17, the external electrode pads 18 and the resin stopper patterns 19. The semiconductor device-composing substrate 10 is obtained in this way (FIG. 6B).

Figure 7A:
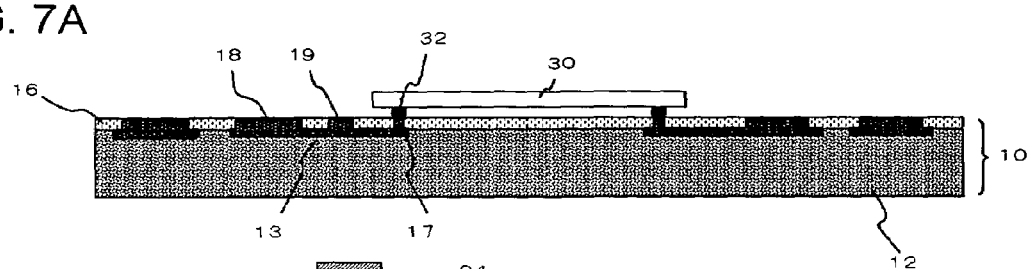
FIGS. 7A to 7C are sectional views showing the example of the manufacturing method of the semiconductor device shown in FIG. 1.
Figure 7B:
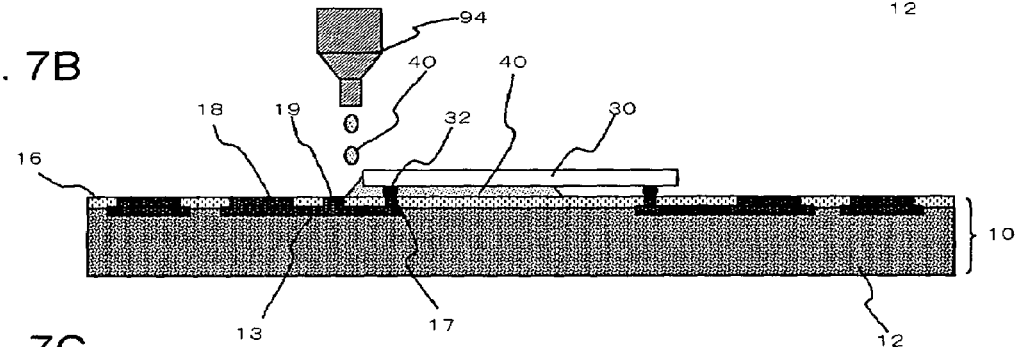
Figure 7C:
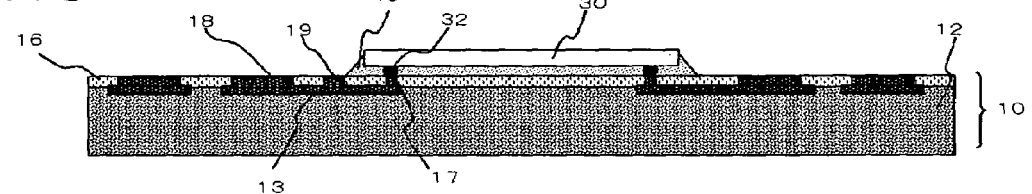

Next, the semiconductor chip 30 is mounted on the semiconductor device-composing substrate 10. The mounting is accomplished by the flip-chip bonding, that is, by connecting the bumps 32 of the semiconductor chip 30 to the chip-connecting electrodes 17 (FIG. 7A). The underfill resin 40 is dropped through a resin dispenser 94 into the gap between the semiconductor chip 30 and the resin stopper patterns 19. The dropped underfill resin 40 intrudes into the gap between the semiconductor device-composing substrate 10 and the semiconductor chip 30 based on the capillary effect (FIG. 7B). The dropping of the underfill resin 40 is continued until the gap is filled up with the underfill resin 40. The underfill resin 40 is then allowed to cure by heating at, for instance, 150° C. (FIG. 7C). The external electrode terminals 50 are further formed on the external electrode pads 18. The formation of the external electrode terminals 50 can be accomplished by, for instance, placing the solder balls on the external electrode pads 18 while coating a flux (not shown) in between, followed by the re-flow process. The semiconductor device 1 shown in FIG. 1 is thus obtained.

Figure 14A:
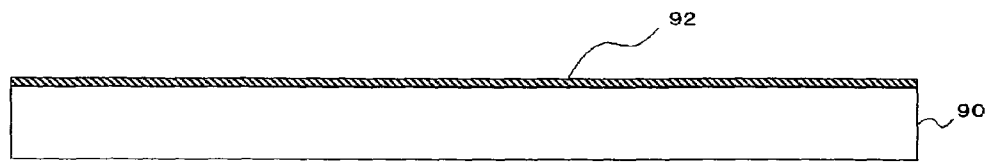
FIGS. 14A and 14B are sectional views showing a modified example of the manufacturing method of the semiconductor device shown in FIG. 1.
Figure 14B:
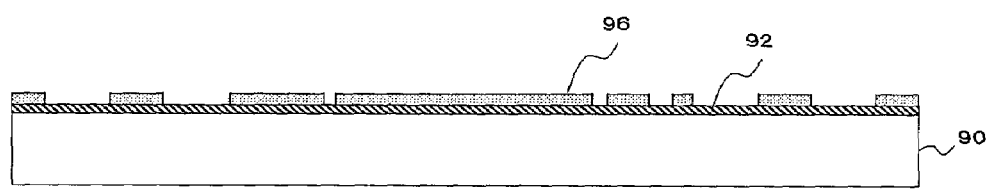

For the case where a non-photo-sensitive resin is used as a material composing the insulating resin layer 16, the semiconductor device-composing substrate 10 can be fabricated as follows. First, similarly to as explained referring to FIG. 4A, the seed layer 92 is formed on the silicon wafer 90 (FIG. 14A). A patterned photoresist 96 is then formed on the seed layer 92 (FIG. 14B).

Figure 15A:
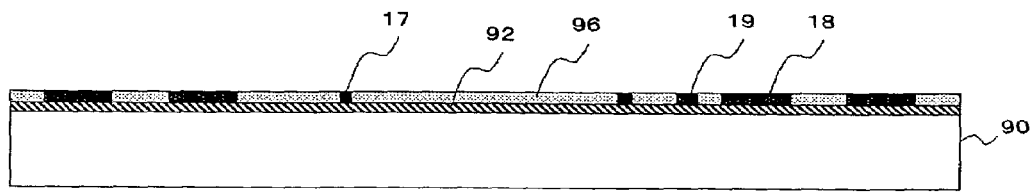
FIGS. 15A and 15B are sectional views showing the modified example of the manufacturing method of the semiconductor device shown in FIG. 1.
Figure 15B:
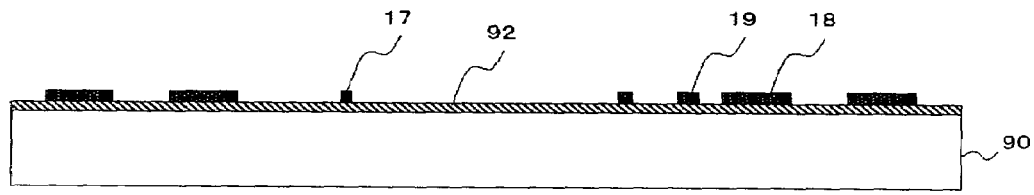

Next, the conductor via-plugs destined for the chip-connecting electrodes 17, the external electrode pads 18 and the resin stopper patterns 19 are formed in the openings of the photoresist 96, by plating using the seed layer 92 as a current supplying layer or the like (FIG. 15A). The photoresist 96 is thereafter removed (FIG. 15B).

Figure 16A:
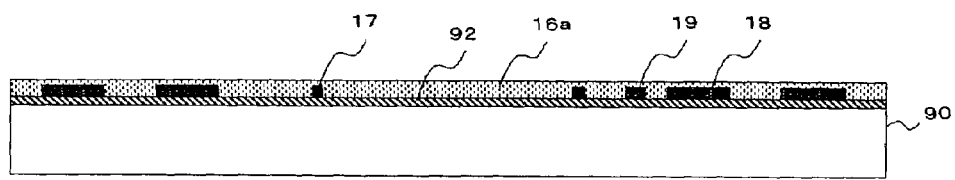
FIGS. 16A and 16B are sectional views showing the modified example of the manufacturing method of the semiconductor device shown in FIG. 1.
Figure 16B:
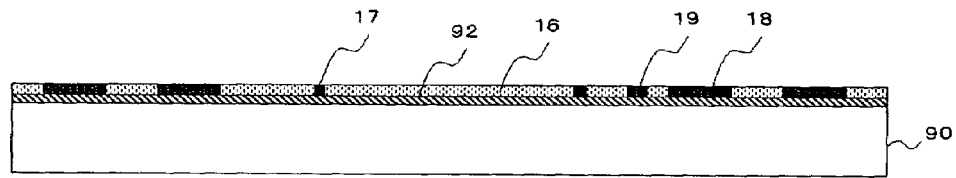

Next, an insulating resin 16a is formed on the seed layer 92 so as to bury the conductor via-plugs (FIG. 16A). The surface of the insulating resin 16a is then ground until the surface of the conductor via-plugs exposes. The insulating resin layer 16 is thus formed (FIG. 16B). The process steps thereafter are the same as described in the above.

Effects of this embodiment will be explained below. The semiconductor device-composing substrate 10 has the resin stopper patterns 19 provided between the mounting region D1 and the external electrode pads 18. The resin stopper patterns 19 are composed of an electric conductor, and therefore have a poorer wettability to the underfill resin 40, as compared with the insulating resin layer 16. This configuration can prevent the underfill resin 40 from climbing over the resin stopper patterns 19 to reach the external electrode pads 18. What is better, the resin stopper patterns 19 are provided in a layer (insulating resin layer 16) different from the interconnect layer 14. The configuration can also successfully prevent the underfill resin 40 from creeping along the interconnects 13 to reach the external electrode pads 18, unlike on the semiconductor device-composing substrate described in the patent document 2. The semiconductor device-composing substrate 10 suitable for fabricating a highly-reliable semiconductor device can thus be realized.

Because the semiconductor device 1 has the semiconductor device-composing substrate 10, the external electrode pads 18 are successfully prevented from being contaminated with the underfill resin 40 during the fabrication. The highly-reliable semiconductor device 1 is thus realized.

Possible techniques of preventing the contamination of the external electrode pads with the underfill resin, other than providing the resin patterns, may include a technique of providing a resin dam, and a technique of widening the distance between the semiconductor chip and the external electrode pads. The former, however, inevitably results in increase in the cost, due to additional steps of forming the resin dam. On the other hand, the latter results in increase in the size of the semiconductor device.

In contrast, this embodiment having the resin stopper patterns 19 provided therein can efficiently avoid the contamination of the external electrode pads 18 as described in the above. The distance between the semiconductor chip 30 (mounting region D1) and the external electrode pads 18 can therefore be reduced on the design basis, so that this embodiment is suitable for downsizing of the semiconductor device-composing substrate 10 and consequently the semiconductor device 1. The resin stopper patterns 19 are formed in the same process with the chip-connecting electrodes 17 and the external electrode pads 18, so that increase in the fabrication cost can be suppressed.

The resin stopper patterns 19 are composed of the same electro-conductive material with the chip-connecting electrodes 17 and the external electrode pads 18. The resin stopper patterns 19 can therefore be formed in the same process steps with chip-connecting electrodes 17 and the external electrode pads 18.

On the surface of the insulating resin layer 16, the entire circumference of the resin stopper patterns 19 is surrounded by the insulating resin layer 16. This configuration can further completely block propagation of the underfill resin 40, at the boundary between the insulating resin layer 16 and the resin stopper pattern 19 where the wettability to the underfill resin 40 changes.

The resin stopper patterns 19 are provided only on one side of the mounting region D1. Injection of the underfill resin 40 from such one side can prevent the spillage thereof to a satisfactory degree. The external electrode pad 18 can therefore be prevented from being contaminated only by the simple configuration. It is, however, to be noted that provision of the resin stopper patterns 19 only on one side of the mounting region D1 is not essential, allowing provision thereof along two or three sides, and even along all of four sides.

On the insulating resin layer 16 of the semiconductor device-composing substrate 10, there are provided the external electrode terminals 50 connected to the external electrode pads 18. Because the contamination of the external electrode pads 18 with the under fill resin 40 is effectively prevented as described in the above, a high level of reliability of connection can be obtained between the external electrode terminal 50 and the external electrode pad 18.

The semiconductor device 1 has a package structure of BGA (ball grid array) type, wherein the external electrode terminals 50 and the semiconductor chip 30 are provided on the same surface of the semiconductor device-composing substrate 10. The semiconductor device 1 is therefore suitable for thinning. The semiconductor device-composing substrate 10 (insulating resin layer 16) has an almost flat surface, ensuring a structure less likely to produce voids during injection of the underfill resin 40.

For the case where the Au film is provided on the surfaces of the chip-connecting electrodes 17, the external electrode pads 18 and the resin stopper patterns 19, exposed in the surface of the insulating resin layer 16, reliability in connection is improved between the chip-connecting electrodes 17 and the bumps 32, and between the external electrode pads 18 and the external electrode terminals 50. This is because Au has a larger wettability than Cu has. The Au film herein may be provided only on the chip-connecting electrodes 17 and the external electrode pads 18, out of the chip-connecting electrodes 17, the external electrode pads 18 and the resin stopper patterns 19.

Second Embodiment

Figure 8:
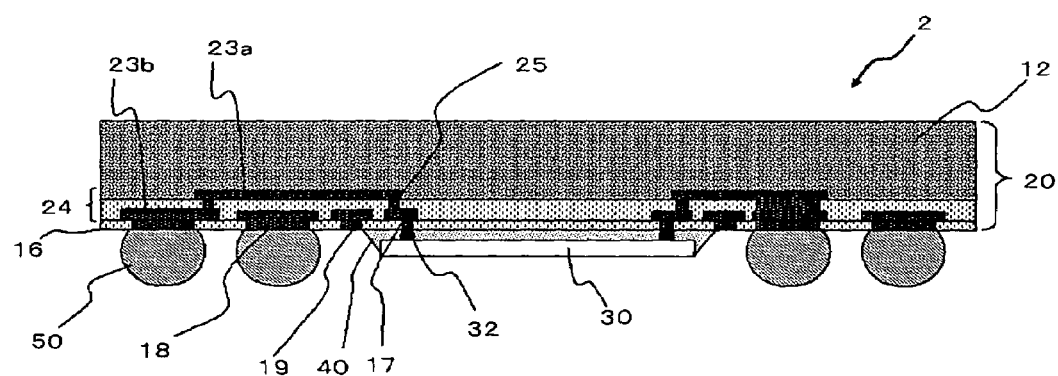
FIG. 8 is a sectional view showing a semiconductor device according to the second embodiment of the present invention.

FIG. 8 is a sectional view showing a semiconductor device according to the second embodiment of the present invention. The semiconductor device 2 has a semiconductor device-composing substrate 20, the semiconductor chip 30, the underfill resin 40, and the external electrode terminals 50. The configurations of the semiconductor chip 30, the underfill resin 40 and the external electrode terminals 50 are same as those in the semiconductor device 1.

The semiconductor device-composing substrate 20 has also the support base 12, an interconnect layer 24, the insulating resin layer 16, the chip-connecting electrodes 17, the external electrode pads 18 and the resin stopper patterns 19. Of these, those other than the interconnect layer 24 have configurations same as those in the semiconductor device 1.

In the surface layer of the support base 12, interconnects 23a are formed. On the support base 12, there is also formed an insulating resin layer having interconnects 23b and via-plugs 25 formed therein. In the semiconductor device 2, the surface layer of the support base 12 containing the interconnects 23a, and the insulating resin layer containing the interconnects 23b and the via-plugs 25 correspond to the interconnect layer 24. The insulating resin layer 16 is formed on the interconnect layer 24. That is, the semiconductor device 2 has a multi-layered interconnect structure.

The chip-connecting electrodes 17 and the external electrode pads 18 are connected to the interconnects 23b in the topmost layer of the interconnect layer 24. The interconnects 23b are connected through the via-plugs 25 to the interconnects 23a in the lower layer. Therefore the chip-connecting electrodes 17 and the external electrode pads 18 are electrically connected with each other, through the interconnects 23a in the lower layer than the interconnects 23b to which they are connected. Therefore, the interconnects connecting the chip-connecting electrodes 17 and the external electrode pads 18, and the resin stopper patterns 19 are electrically isolated from each other.

Thus-configured semiconductor device 2 raises the effects below, in addition to the effects raised by the semiconductor device 1. That is, the interconnects connecting the chip-connecting electrodes 17 and the external electrode pads 18, and the resin stopper patterns 19 are electrically isolated from each other, so that signal paths between the chip-connecting electrodes 17 and the external electrode pads 18 can avoid inclusion of the resin stopper patterns 19. Inclusion of the resin stopper patterns 19, unnecessary for signal transmission, in the signal paths may result in degradation in the electrical characteristics.

In this embodiment, the interconnects connecting the chip-connecting electrodes 17 and the external electrode pads 18, and the resin stopper patterns 19 are electrically isolated, by using the interconnects 23a in the lower layer in the multi-layered interconnect. This configuration can improve the degree of freedom in designing the resin stopper patterns 19. This is because it is necessary to arrange the interconnects so as to avoid short-circuiting therebetween through the resin stopper patterns 19 when the above-described interconnects and the resin stopper patterns 19 are not electrically isolated, whereas there is no limitation on the arrangement when they are isolated.

The semiconductor device-composing substrate and the semiconductor device of the present invention are not limited to the above-described embodiments, and may be modified in various ways. For example, the above-described embodiments dealt with the case where a resin substrate was used as the support base, whereas a silicon substrate may also be used as the support base.

Figure 9:
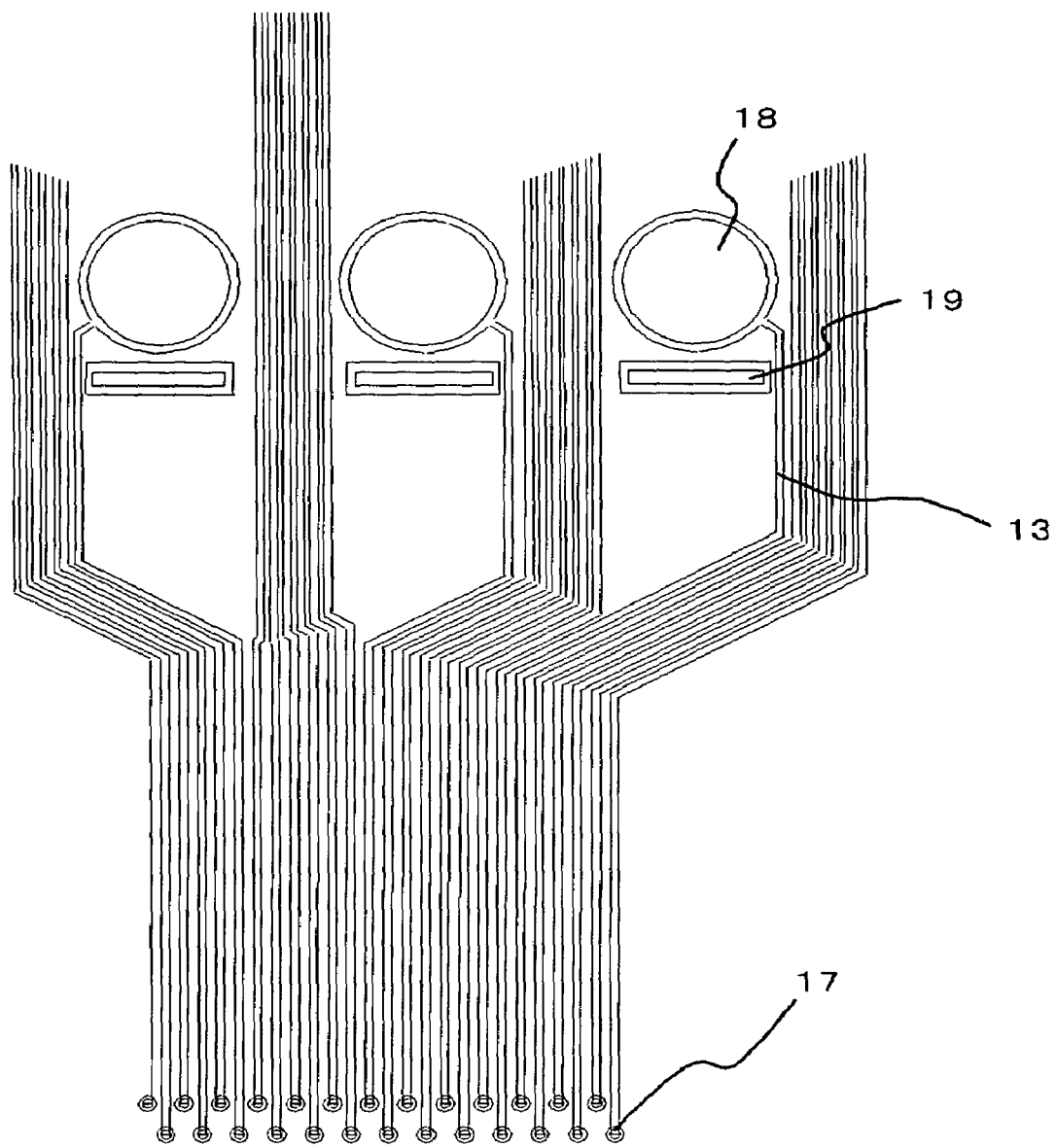
FIG. 9 is a plan view explaining a modified example of the semiconductor device according to the embodiment.
Figure 10:
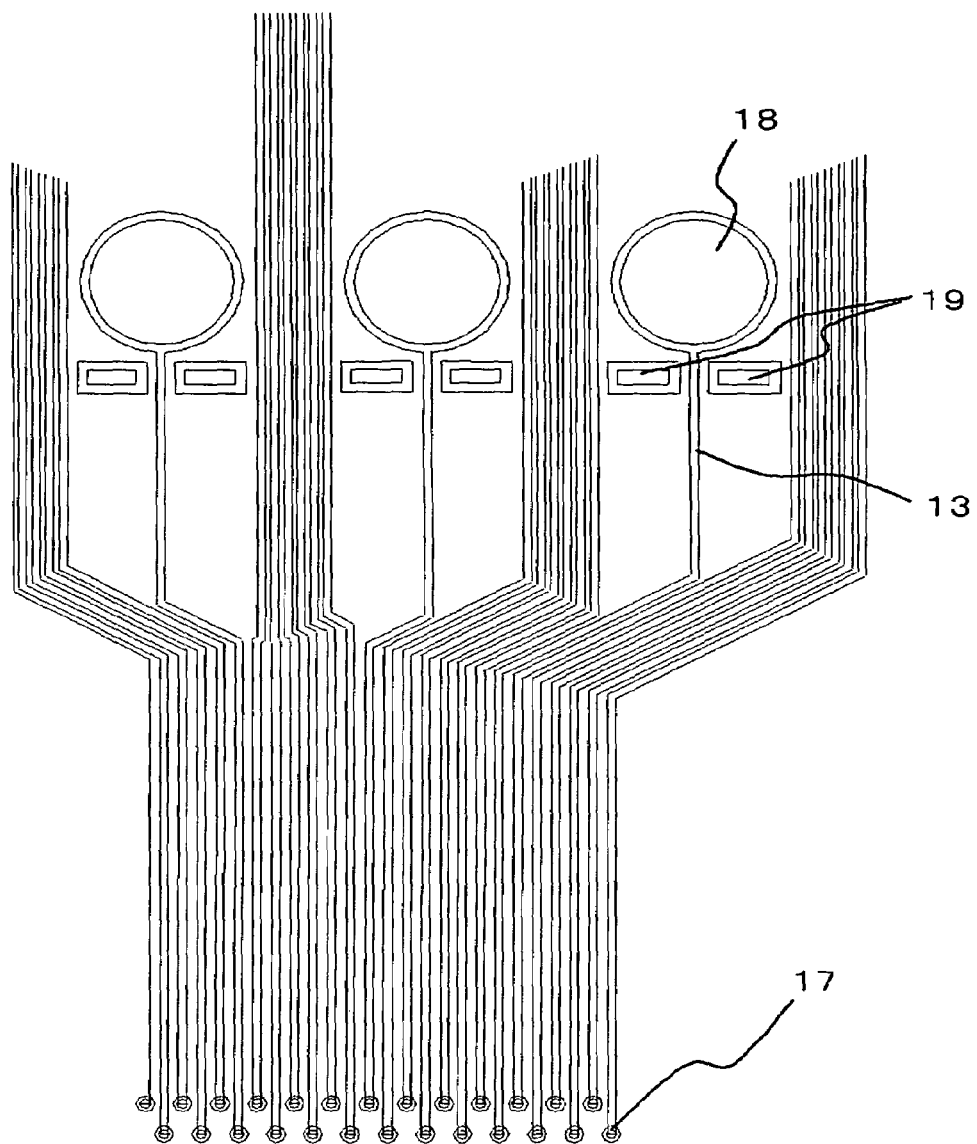
FIG. 10 is a plan view explaining another modified example of the semiconductor device according to the embodiment.

Also the interconnects and the resin stopper patterns are not limited to those shown in FIG. 3, but may be modified to have various layouts. For example, as shown in FIG. 9, the interconnects 13 may be formed so as to go around the resin stopper patterns 19. It is also allowable, as shown in FIG. 10, to form the resin stopper patterns 19 respectively on both sides of each interconnect connected to each external electrode pad 18. In FIGS. 9 and 10, the resin stopper patterns 19 are formed, in a plan view, so as not to overlap the interconnects 13 connecting the chip-connecting electrodes 17 and the external electrode pads 18. Therefore these configurations can electrically isolate the interconnects from the resin stopper patterns, even for the case of using a single-layered interconnect.

Figure 11:
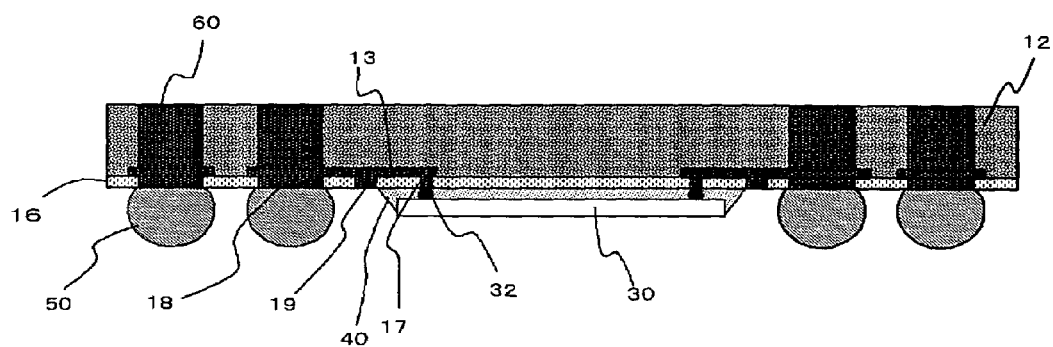
FIG. 11 is a sectional view explaining another modified example of the semiconductor device according to the embodiment.

It is also allowable, as shown in FIG. 11, to form conductor via-plugs 60 in the support base 12. Each conductor via-plug 60 has one end connected to the interconnect 13, and the other end exposed in the back surface of the support base 12 (surface opposite to the surface having the semiconductor chip 30 bonded thereto). This configuration allows extraction of signals from the semiconductor chip 30 also from the back side of the support base 12.

Figure 12:
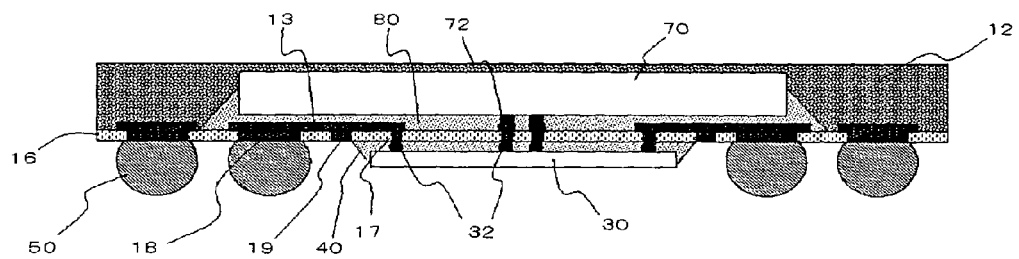
FIG. 12 is a sectional view explaining another modified example of the semiconductor device according to the embodiment.
Figure 13:
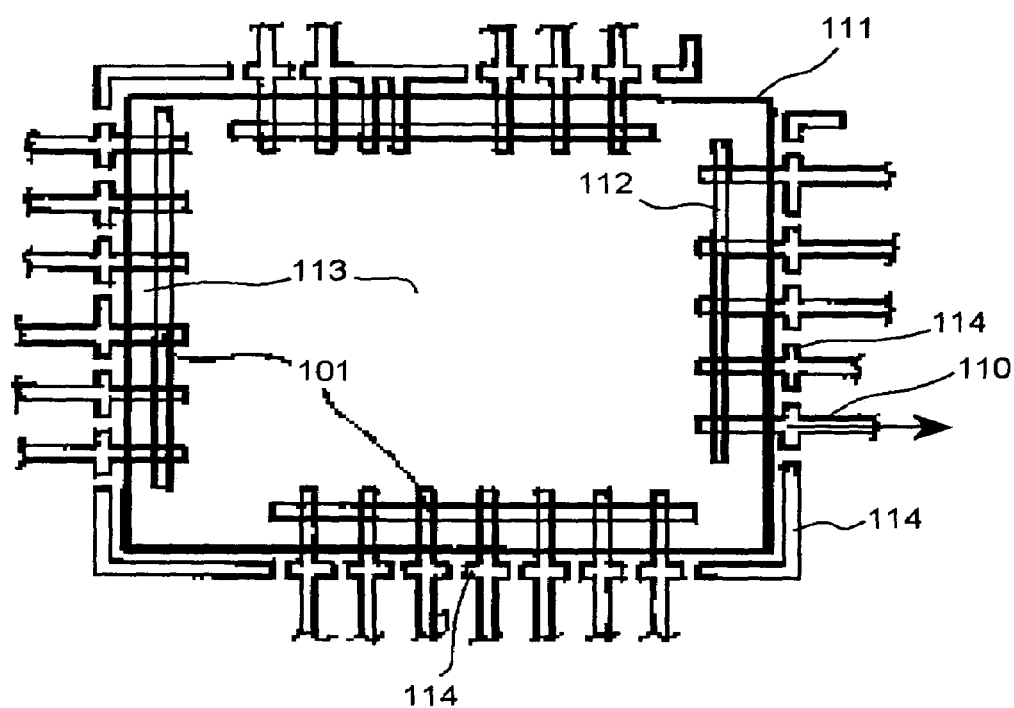
FIG. 13 is a plan view showing the semiconductor device-composing substrate disclosed in the patent document 2.

It is still also allowable, as shown in FIG. 12, to bury a semiconductor chip 70 (second semiconductor chip), independent from the semiconductor chip 30 (first semiconductor chip), in the support base 12. The semiconductor chip 70 has bumps 72, and the bumps 72 are connected to the interconnects 13. An underfill resin 80 is filled in a gap between the semiconductor chip 70 and the insulating resin layer 16. A high-density, multi-chip package can thus be obtained, by burying a semiconductor chip also in the support base 12.

It is apparent that the present invention is not limited to the above embodiment, and may be modified and changed without departing from the scope and spirit of the invention.

What is claimed is:

1. A semiconductor device-composing substrate having a mounting region on which a semiconductor chip is to be mounted, comprising:
   an interconnect layer provided on a support base, and including an interconnect;
   an insulating layer provided on said interconnect layer;
   a chip-connecting electrode provided in said insulating layer located in said mounting region, one end of which connected to said interconnect, and the other end of which to be connected to a bump of said semiconductor chip;

an external electrode pad provided in said insulating layer located outside said mounting region, one end of which connected to said interconnect, and the other end of which to be connected to an external electrode terminal to be provided on said insulating layer; and a resin stopper pattern provided in said insulating layer located between said mounting region and said external electrode pad, being exposed in a surface of said insulating layer, and being composed of an electro-conductive material.

2. The semiconductor device-composing substrate according to claim 1,
wherein said resin stopper pattern is composed of the same electro-conductive material as said chip-connecting electrode and said external electrode pad.

3. The semiconductor device-composing substrate according to claim 1,
wherein, on said surface of said insulating layer, the entire circumference of said resin stopper pattern is surrounded by said insulating layer.

4. The semiconductor device-composing substrate according to claim 1,
wherein said resin stopper pattern is provided only on one side of said mounting region.

5. The semiconductor device-composing substrate according to claim 1,
wherein said interconnect connecting said chip-connecting electrode and said external electrode pad, and said resin stopper pattern are electrically isolated from each other.

6. The semiconductor device-composing substrate according to claim 5,
wherein said interconnect is a multi-layered interconnect; and said chip-connecting electrode and said external electrode pad are electrically connected with each other, via an interconnect in a lower layer than the topmost interconnect to which said chip-connecting electrode and said external electrode pad are connected.

7. The semiconductor device-composing substrate according to claim 5,
wherein said resin stopper pattern is provided in a region not overlapping, in a plan view, said interconnect connecting said chip-connecting electrode and said external electrode pad.

8. The semiconductor device-composing substrate according to claim 1,
wherein an Au film is formed respectively on said other end of said chip-connecting electrode and said other end of said external electrode pad.

9. A semiconductor device comprising:
said semiconductor device-composing substrate according to claim 1,
a semiconductor chip having a bump, and mounted on said mounting region of said semiconductor device-composing substrate through connection of said bump to said chip-connecting electrode; and
an underfill resin filled between said semiconductor device-composing substrate and said semiconductor chip.

10. The semiconductor device according to claim 9,
further comprising an external electrode terminal provided on said insulating layer of said semiconductor device-composing substrate, and connected to said external electrode pad.

* * * * *